United States Patent [19]
Holder

[11] Patent Number: 5,904,768
[45] Date of Patent: May 18, 1999

[54] PROCESS FOR CONTROLLING THE OXYGEN CONTENT IN SILICON WAFERS HEAVILY DOPED WITH ANTIMONY OR ARSENIC

[75] Inventor: John D. Holder, Lake St. Louis, Mo.

[73] Assignee: MEMC Electronic Materials, Inc., St. Peters, Mo.

[21] Appl. No.: 08/732,527

[22] Filed: Oct. 15, 1996

[51] Int. Cl.[6] .................................................. C30B 15/20
[52] U.S. Cl. ........................... 117/20; 117/208; 117/900; 117/932
[58] Field of Search ............................ 117/20, 208, 900, 117/932; 65/420

[56] References Cited

U.S. PATENT DOCUMENTS

| | | | |
|---|---|---|---|
| 3,265,469 | 8/1966 | Hall | 117/203 |
| 3,511,610 | 5/1970 | Dohmen | 117/203 |
| 3,615,261 | 10/1971 | Causey et al. | 23/301 SP |
| 4,330,362 | 5/1982 | Zulehner | 117/33 |
| 4,417,943 | 11/1983 | Jacques et al. | 117/15 |
| 5,131,974 | 7/1992 | Oda et al. | 117/20 |
| 5,423,283 | 6/1995 | Seki | 117/19 |
| 5,477,805 | 12/1995 | Izunome et al. | 117/13 |
| 5,524,574 | 6/1996 | Huang et al. | 117/20 |
| 5,573,591 | 11/1996 | Ikezawa et al. | 117/20 |
| 5,578,123 | 11/1996 | Vilzmann et al. | 117/13 |
| 5,593,494 | 1/1997 | Falster | 117/2 |

FOREIGN PATENT DOCUMENTS

| | | | |
|---|---|---|---|
| 0 435 440 | 11/1989 | European Pat. Off. | C03B 15/30 |
| 0 669 413 | 12/1994 | European Pat. Off. | C30B 29/06 |
| 07232994 | 9/1995 | Japan | C30B 27/02 |
| 08245293 | 9/1996 | Japan | C30B 27/02 |

OTHER PUBLICATIONS

X. Huang et al. "Evaporation of Oxygen–Bearing Species from Si Melt and Influence of Sb Addition" Japan Jour. of Applied Physics, vol. 33, Part 1, No. 4A (1994) pp. 1717–1722.

X. Huang et al. "Effect of Antimony–Doping on the Oxygen Segregation Coefficient in Silicon Crystal Growth" Journal of Crystal Growth, vol. 149 (1995) pp. 59–63.

K. Izunome et al. "Control of Oxygen Content in Heavily Sb–Doped CZ Si Crystal by Adjusting Ambient Pressure" Mat. Res. Soc. Symp. Proc., vol. 378 (1995) pp. 53–58.

Zulehner "Status and Future of Silicon Crystal Growth" Materials Science & Engineering, vol. B4, Nos. 1/4, (Oct. 1989) pp. 1–10.

*Primary Examiner*—Felisa Hiteshew
*Attorney, Agent, or Firm*—Senniger, Powers, Leavitt & Roedel

[57] ABSTRACT

A process and apparatus for regulating the concentration and distribution of oxygen in a single crystal silicon rod pulled from a silicon melt, optionally doped with antimony or arsenic, in accordance with the Czochralski method wherein an atmosphere is maintained over the melt. In batch embodiments of the process, the gas pressure of the atmosphere over the melt is progressively increased to a value in excess of 100 torr as the fraction of silicon melt solidified increases. In continuous embodiments of the process, the gas pressure of the atmosphere over the melt is maintained at or near a constant value in excess of 100 torr. The process and apparatus are further characterized in that a controlled flow of inert gas is used to remove vapors and particulate away from the surface of the rod and melt, resulting in the production of a single crystal silicon rod having zero dislocations.

32 Claims, 7 Drawing Sheets

PROCESS FOR CONTROLLING THE OXYGEN CONTENT IN SILICON WAFERS HEAVILY DOPED WITH ANTIMONY OR ARSENIC

BACKGROUND OF THE INVENTION

This invention relates to a process and apparatus for regulating the concentration and distribution of oxygen in single crystal silicon rods, optionally doped with antimony or arsenic, prepared according to the Czochralski method and, in particular, to such a process and apparatus in which the gas pressure of the atmosphere over the melt is adjusted to a value in excess of 100 torr during the crystal growth process.

Oxygen in the silicon crystal may have both favorable and unfavorable effects. In various heat treatment processes conducted during the manufacture of electrical devices, the oxygen in the crystal may cause defects such as precipitates, dislocation loops and stacking faults. Alternatively, it may cause electrically active defects resulting in devices with inferior performance characteristics. The presence of oxygen in the crystal, however, increases the mechanical strength of silicon wafers and the crystal defects may improve the yield of conforming products by entrapping contaminants of heavy metals. Accordingly, the oxygen content of the silicon crystal is an important factor for product quality which must be carefully controlled in accordance with the requirements of the ultimate application for the silicon wafers.

In the conventional Czochralski method, the silicon melt is contained in a quartz crucible. During the process, some of the quartz dissolves into the melt as oxygen and silicon or some oxygen-silicon complex. A portion of the dissolved oxygen or oxygen-silicon complex migrates to the free melt surface and evaporates as silicon monoxide. Another portion of the dissolved oxygen or oxygen-silicon complex gets incorporated into the growing crystal. The remainder of the oxygen or oxygen-silicon complex is retained in the molten silicon.

As the crystal growth process continues, the free melt surface area remains constant while the melt level in the crucible decreases. As the melt level decreases, less of the surface area of the crucible is exposed to the melt and, therefore, less oxygen is incorporated into the melt. The net effect is that the bulk oxygen content of the melt decreases, which results in the production of silicon rods having axially decreasing oxygen contents.

The addition of antimony or arsenic as dopants causes the decrease in oxygen content to become more severe, an occurrence known as oxygen reduction. Oxygen reduction is the result of an increase in the vapor pressure of the silicon monoxide gas at the free melt surface which is caused by the presence of antimony or arsenic in the melt. This increase in vapor pressure causes the rate of evaporation of silicon monoxide to increase, resulting in an even lower bulk oxygen content in the melt.

Processes have been proposed for controlling the oxygen content in single crystal silicon and antimony doped silicon rods. For example, Seki disclosed in U.S. Pat. No. 5,423,283 a process for controlling the oxygen content in antimony doped single crystal silicon rods in which (i) the rotation rate of the crucible is gradually increased as crystal growth proceeds or (ii) a pulse-like change in the rotation rate of the quartz crucible is superimposed over a continuous increase in the crucible rotation rate. In either case, however, the atmosphere in the chamber is kept within the range of 7 to 38 torr.

Oda et al. disclosed in U.S. Pat. No. 5,131,974 a process for controlling the oxygen content of a single crystal silicon rod, prepared by the Czochralski method, whereby the pressure in the chamber and the supply rate of inert gas to the chamber are controlled with respect to the length of the crystal or the passage of time. This process provides for slowing the rate of evaporation of silicon monoxide by either decreasing the flow of inert gas into the chamber or increasing the pressure in the chamber.

Izunome et al., in the article "Control of Oxygen in Heavily Sb-Doped CZ Crystal by Adjusting Ambient Pressure," Mat. Res. Soc. Symp. Proc., Vol. 378 (1995), pp. 53–58, also disclosed that the evaporation of silicon monoxide from antimony doped silicon melts could be suppressed by increasing the pressure of the atmosphere over the melt. Antimony doped silicon rods pulled under a constant pressure of 100 torr were found to have a higher oxygen content than those pulled under a constant pressure of 30 torr.

The processes disclosed by Oda and Izunome, however, fail to address the problems caused by vapors which are trapped in the chamber as the pressure exceeds about 50 torr and which increase in severity as pressure increases. As the pressure over the melt increases, the unstable silicon monoxide vapors readily react to form silicon dioxide and silicon particulate. If this particulate comes into contact with the surface of the silicon rod or melt, a dislocation in the crystal, or a crystal defect, is formed. In addition, if not removed from the chamber, the trapped vapors and particulate will deposit on the surface of the view port window of the crystal puller. This deposit interferes with the crystal pulling process by obstructing the operator's view of the chamber and the silicon rod, as the process proceeds.

SUMMARY OF THE INVENTION

Among the objects of the present invention, therefore, may be noted the provision of a process of controlling the oxygen content in a single crystal silicon rod having medium to high oxygen content, i.e., about 13 to about 18 PPMA (parts per million atomic, ASTM standard F-121-83), pulled in accordance with the Czochralski method from a silicon melt, the provision of such a process in which the single crystal silicon rod is optionally doped with antimony or arsenic, the provision of such a process in which elevated pressures are employed to influence oxygen content, the provision of such a process in which vapors and particulate are removed during the production of a single crystal silicon rod, and the provision of such a process in which process equipment is protected from deposit of vapors and particulate during the process.

Further among the several objects and features of the present invention may be noted the provision of a crystal puller in which vapors and particulate are purged from the crystal puller; the provision of such a crystal puller in which high velocity curtains of purge gas aspirate the vapors and particulate into exhaust ports of the crystal puller; the provisions of such a crystal puller which substantially confines vapors and particulate to a region adjacent to the melt; the provision of such a crystal puller which inhibits deposit of material onto a view port window.

Briefly, therefore, the present invention is directed to a process for controlling the oxygen content in a single crystal silicon rod that is pulled in accordance with the Czochralski method from a silicon melt which optionally may contain antimony or arsenic as a dopant. The crystal growing process may be carried out as a batch process in which there is a single charge of polysilicon to the crucible and the silicon melt level decreases as the length of the solidified single crystal increases or as a continuous process in which polysilicon is continuously charged to the crucible to maintain a relatively constant silicon melt level as the length of the solidified single crystal increases. In batch embodiments, the gas pressure of the atmosphere over the melt is progressively increased as the fraction of silicon melt solidified increases. In continuous embodiments, the gas pressure of the atmosphere over the melt is maintained at or near a constant value. In either of the embodiments, gas pressures in excess of 100 torr are achieved during the crystal growing process.

The present invention is further directed to a process for removing vapors and particulate generated during the production of a single crystal silicon rod which is pulled in accordance with the Czochralski method. The process comprises purging the atmosphere within the crystal puller with curtains of purge gas which act to aspirate vapors and particulate radially outwardly away from the melt and silicon rod. In a preferred embodiment, a cap is used to isolate a portion of the atmosphere above the crucible.

The present invention is further directed to an apparatus for removing vapors and particulate generated during the production of a single crystal silicon rod. The apparatus includes a shell which contains the crystal growth chamber and the pull chamber, a purge system which acts to aspirate vapors and particulate radially outwardly from the surface of the silicon rod and from above the center of the crucible, and exhaust ports to allow the removal of vapors and particulate entrained in the purge gas stream. In a preferred embodiment, a cap is used to isolate a portion of the atmosphere above the crucible.

The present invention is still further directed to an apparatus for preventing the deposit of condensate and particulate on the view port window of the crystal puller. This apparatus employs a plurality of thin baffles and a flow of inert gas, such that vapors in the crystal growth chamber stagnate and deposit on the surface of the baffles. In a preferred embodiment, a sacrificial window is used to prevent any build up of deposit upon the crystal puller view port window.

Other objects will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENTS

Figure 1:
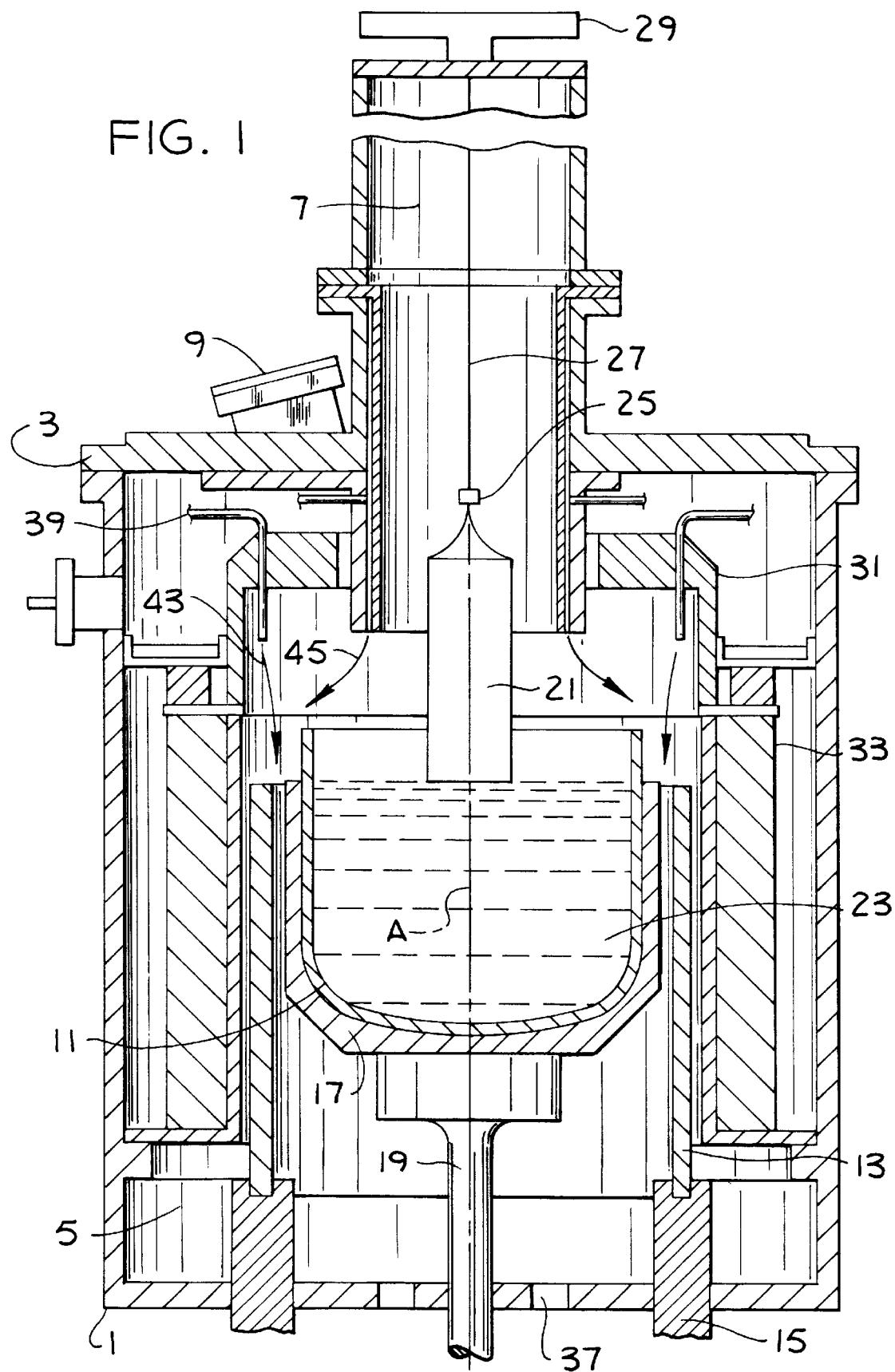
FIG. 1 is a schematic, sectional view of a crystal puller having a Czochralski crystal growth chamber in accordance with the embodiment of the present invention.

Referring now to FIG. 1, a Czochralski crystal puller constructed in accordance with the principles of the present invention is indicated generally at 1. The crystal puller includes a shell 3 enclosing a volume which includes a crystal growth chamber 5 and a crystal pulling chamber 7. The shell can be hermetically sealed in order to maintain a controlled atmosphere within the two chambers. A view port 9 in the shell permits observation of the crystal growth process.

Within the crystal growth chamber 5 is a crucible 11 surrounded by a tubular graphite heating panel 13, which is mounted on electrodes 15 that connect the panel to an electrical power source (not shown). The crucible 11 is mounted on a turntable 17 having a shaft 19 connected to a crucible drive unit (not shown) for rotating the crucible about a central axis A, and raising and lowering the crucible as necessary. The crucible 11 has an open top and contains a quantity of molten silicon. A single crystal silicon rod 21 is pulled from a melt 23, starting with a seed crystal (not shown) held in a chuck 25 attached to a pull cable 27 connected to a support structure 29. The pull cable 27 is rotated and raised and lowered as necessary by operation of the support structure 29.

A cap 31, having the shape of an inverted cup, is supported by an internal wall 33 and functions to somewhat isolate the portion of the atmosphere within the crystal growth chamber 5 directly above the crucible 11 from the remainder of the atmosphere. The cap 31 is made of high-purity quartz or other suitable material which will not contaminate the melt 23 in the crucible 11 and is heated to prevent the condensation of vapors upon its surface during the process. A central opening 35 in the top of the cap 31 (see FIG. 3) permits the silicon rod 21 to pass through it as the pulling process continues. The cap 31 also has an opening 36A which allows for observation of the crystal growth process through view port 9, and an opening 36B which allows for conventional monitoring of the process by sensors (not shown).

Exhaust ports 37 in the bottom of the shell permit vacuum pressures to be drawn in the crystal puller 1 by pumps (not shown) outside the shell 3. Air is substantially evacuated and replaced by an inert purge gas (e.g., argon) during the process. The purge gas is fed into the shell 3 through a nozzle (not shown) at the top of the pulling chamber 7, as well as through other ports and nozzles, to be hereinafter described, forming a purge system of the present invention.

To grow a single crystal silicon rod 21, a quantity of polysilicon is charged to the crucible 11 and an electric current is passed through the heating panel 13 to melt the charge. The silicon melt 23 may contain certain dopants, such as antimony or arsenic, which are introduced in order to modify the electrical characteristics of the silicon, as known in the art. In the preparation of a highly doped silicon rod, a sufficient quantity of antimony or arsenic is added such that the rod has a dopant content which yields a resistivity of preferably about 8 to about 20 mohm-cm (milliohm-centimeter).

While the crucible 11 and a seed crystal are rotated, the seed crystal is lowered to make contact with the melt 23 and then slowly withdrawn from the melt while an atmosphere is kept over the melt in the growth chamber 5. The silicon solidifies on the seed crystal to produce the growth of a single crystal silicon rod 21. In batch embodiments of the process, the gas pressure of the atmosphere over the melt 23 is progressively increased as the fraction of melt solidified increases. For a melt containing antimony or arsenic, the gas pressure over the melt will have an initial value of about 15 torr, preferably about 25 torr, more preferably about 30 torr, and a final value of about 250 torr, preferably 275 torr and more preferably about 300 torr. Experience has shown that while a final value in excess of 300 torr may be used, exceeding this value has no effect on the resulting oxygen content. As used herein, the term initial value shall mean the gas pressure value when growth of the seed-cone is complete and formation of the silicon rod main body has begun, and the term final value shall mean the gas pressure value when growth of the silicon rod main body is complete and formation of the end-cone has begun.

As the process proceeds and the length of the silicon rod 21 increases, the gas pressure over the silicon melt 23 increases to compensate for the decreasing oxygen content in the melt by inhibiting silicon monoxide evaporation. This increase in pressure acts to maintain the axial oxygen content of the rod within the range of preferably about 13 to about 18 PPMA and, more preferably, about 14 to about 17 PPMA. The rate at which the pressure is increased will be a function of the rate of silicon monoxide evaporation. The presence of antimony or arsenic results in an increased rate of evaporation, due to the increase in silicon monoxide vapor pressure which is caused by these dopants.

In the preparation of an antimony or arsenic doped silicon rod, the gas pressure of the atmosphere over the melt will preferably exceed about 50 torr after about 25 percent of the melt has solidified, about 100 torr after about 60 percent of the melt has solidified, and about 200 torr after about 75 percent of the melt has solidified. More preferably, the gas pressure will exceed about 75 torr after about 25 percent of the melt has solidified, about 100 torr after about 50 percent of the melt has solidified, and about 240 torr after about 75 percent of the melt has solidified.

In continuous charge embodiments of the process, the gas pressure of the atmosphere over the melt is maintained at a generally constant value which is in excess of 100 torr throughout the process. This means that the initial and final values of the gas pressure, as defined above, will be about the same. Typically, the gas pressure will be maintained at about 250 torr, preferably about 275 torr, and most preferably about 300 torr.

The purge system, in a first embodiment, includes four purge gas nozzles 39 (only two are shown) located at 90° intervals around the central axis A of the crucible 11. It is to be understood that the number of nozzles used and their angular position may be other than that described and fall within the scope of the present invention. Generally, it has been observed that the best results occur when the nozzles 39 are located within about 28 to about 30 cm of each other. The nozzles 39 are received through and mounted on the cap 31 for delivering high velocity gas in streams directed downwardly along lines of flow located radially outwardly from the periphery of the crucible 11. Holes 41 in the cap 31 for reception of the nozzles 39 may be seen in FIG. 3. Together, the streams of purge gas emanating from the nozzles 39 form a first generally cylindrical curtain of gas around the central axis of the crucible 11. It is to be understood that the curtain may not necessarily be continuous all the way around the central axis A of the crucible 11.

The first curtain of gas flows downwardly outside the perimeter of the open top of the crucible 11 at velocities which create a region of low pressure within the crystal growth chamber 5 radially outwardly from the open top of the crucible. The direction of flow is indicated generally by arrows 43 in FIG. 1. Vapors and particulate over the crucible 9 are aspirated into the flow of gas in the first curtain and out of the growth chamber 5 through the exhaust ports 37.

A second downwardly flowing, generally cylindrical curtain of purge gas is provided radially inwardly of the first curtain and radially inwardly of the perimeter of the open top of the crucible 11. The second curtain has a somewhat lesser velocity than the first curtain, but still creates a region of low pressure tending to aspirate vapors and particulate into its flow. Suction through the exhaust ports 37 shapes the flow of gas in the second curtain as illustrated by arrows 45 in FIG. 1. The second curtain flows downwardly and radially outwardly near the top of the crucible 11 to pass around the top of the crucible to merge with the first curtain. The combined effect of the first and second curtains is to substantially purge the entire region immediately above the crucible 11 of vapors and particulate which might otherwise be deposited on an internal surface of the crystal puller 1.

Figure 2:
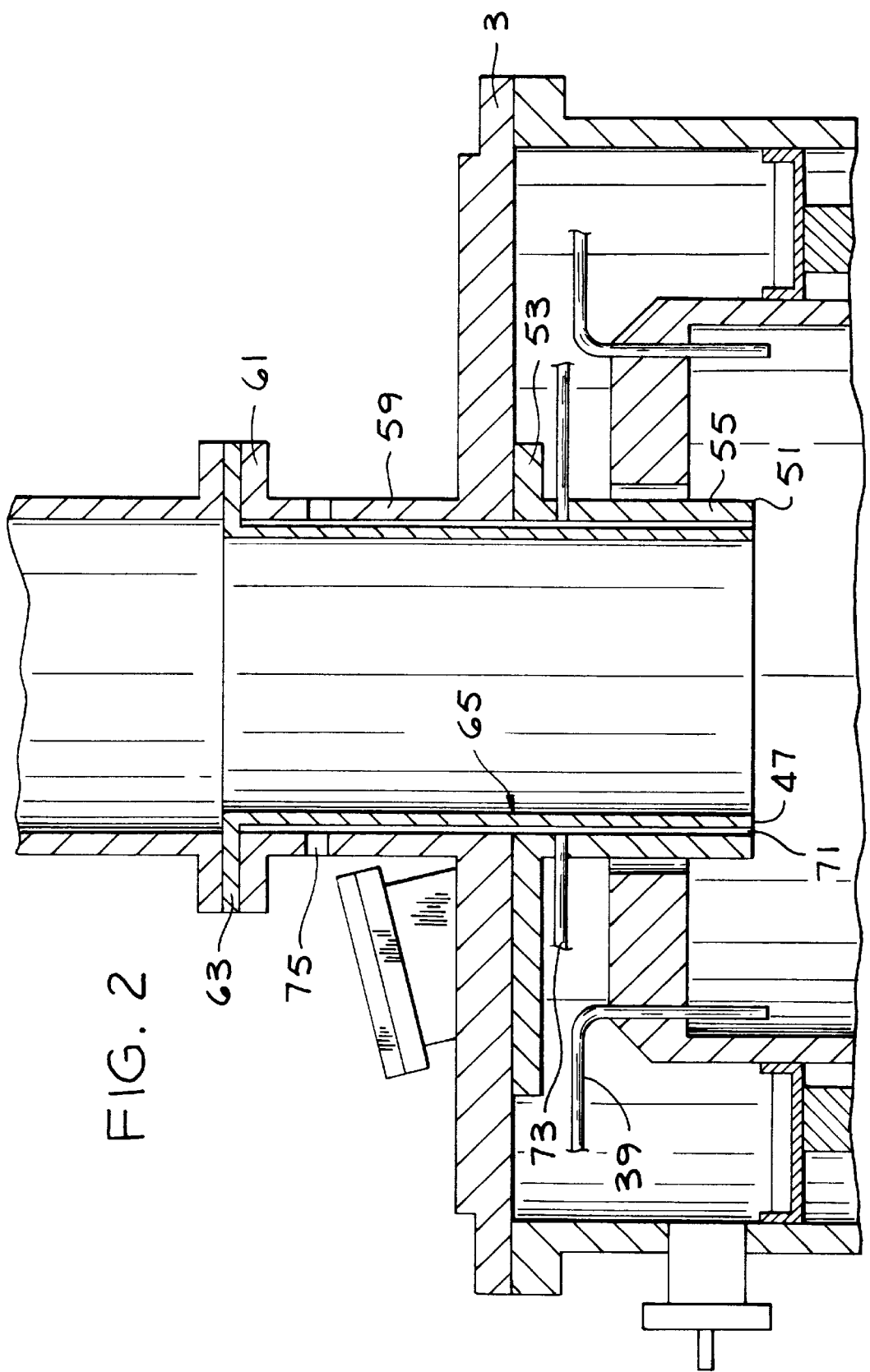
FIG. 2 is an enlarged, fragmentary sectional view of the crystal puller of FIG. 1.
Figure 3:
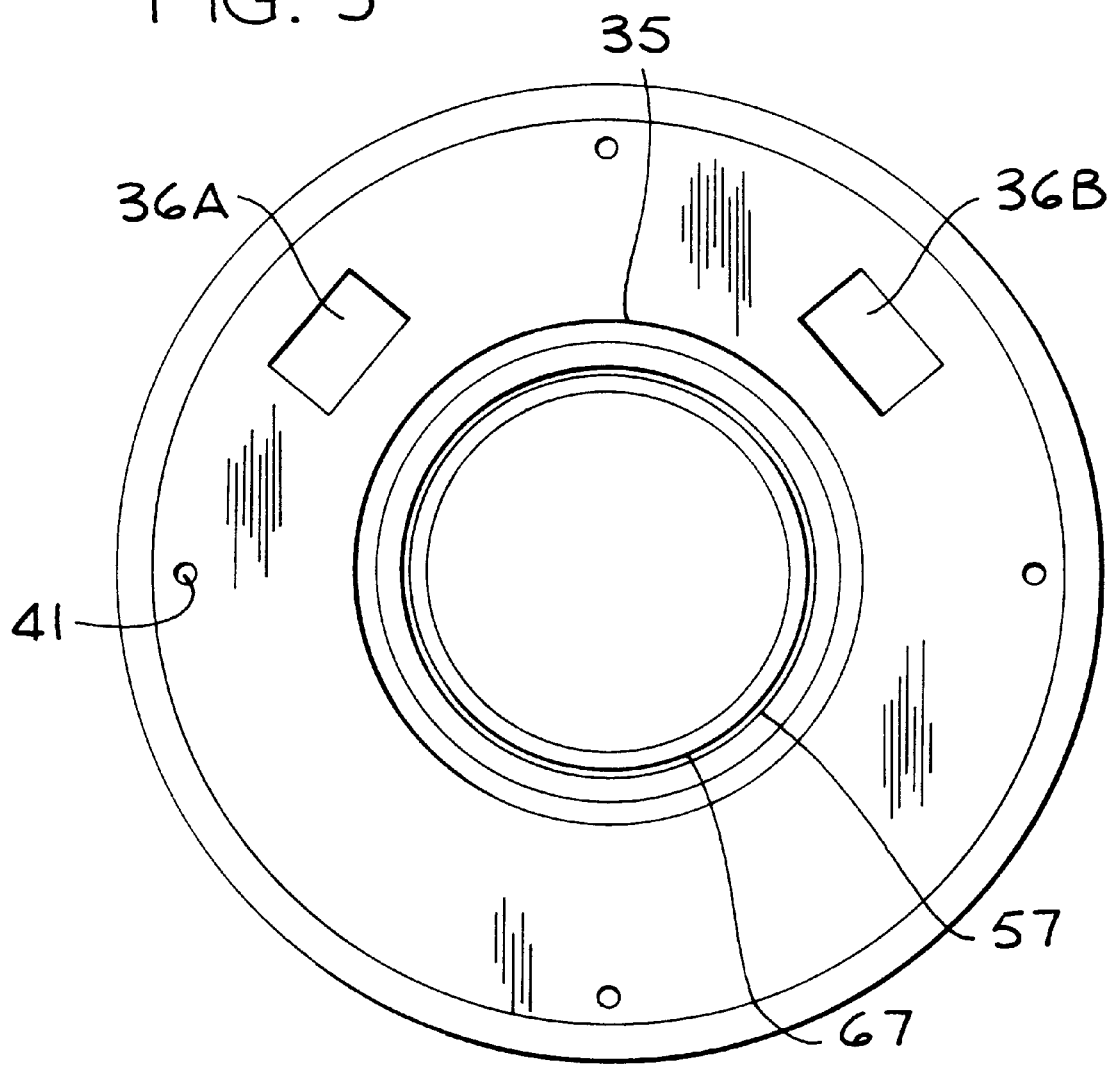
FIG. 3 is a bottom plan view of a cap used in the crystal growth chamber.

Referring now to FIGS. 2 and 3, the second curtain is formed by a sleeve 47 and cooperating neck portions of the crystal puller 1. A collar 51 includes a flange 53 mounted on the shell 3 within the crystal pulling chamber 5 and a tubular portion 55 depending from the flange. The tubular portion 55 has a cylindrical interior surface 57 (see FIG. 3) of a first diameter of about 20 to about 22 cm. In the preferred embodiment, the collar 51 constitutes an internal neck portion of the shell 3. An external neck portion 59 of the shell 3 projecting upwardly from a top wall portion of the shell has an annular flange 61 and an interior surface of substantially the same diameter as the first diameter of the collar 51. The sleeve 47 has an annular flange 63 overlying the annular flange 61 of the external neck portion 59 so that the sleeve is supported by the shell 3. A tubular portion 65 depending from the annular flange 63 of the sleeve 47 has a cylindrical external surface 67 (see FIG. 3) of a second diameter of about 19 to about 21 cm, which is smaller than the first diameter of the interior surfaces of the collar 51 and external neck portion 59.

An external surface 67 of the sleeve 47 and interior surfaces 57 of the external neck portion 59 and collar 51 of the shell 3 define an annular passage 71 extending downwardly through the cap 31 into the crystal growth chamber 5 and terminating above the crucible 11. Preferably, purge gas lines feed purge gas into the annular passage 71 inside the crystal growth chamber 5 through ports 73 in the collar 51, or alternatively through ports 75 (as shown in phantom) in the external neck portion 59. The purge gas fills the annular passage 71 and escapes downwardly out of the passage in a cylinder to form the second curtain of gas. The velocity of the second curtain is less than that of the first curtain. When used in conjunction with batch embodiments of the process, the velocity of the second curtain decreases as the gas pressure over the melt increases. The velocity of purge gas from the second curtain will preferably exceed about 250 cm/second at about 30 torr, about 75 cm/second at about 100 torr, about 35 cm/second at about 200 torr and about 20 cm/second at about 300 torr. More preferably, the velocity will exceed 280 cm/second at about 30 torr, about 80 cm/second at about 100 torr, about 40 cm/second at about 200 torr and about 25 cm/second at about 300 torr. It is to be understood that the velocity of gas in the second curtain may be other than that described without departing from the scope of the present invention.

The first curtain is formed by the four purge gas nozzles 39 constructed of stainless steel and connected to the inert gas source by stainless steel flex hose (not shown). When used in conjunction with batch embodiments of the process, the velocity of gas emitted by each jet is also diminished as the gas pressure over the melt 23 increases. The velocity is preferably about 325 cm/second at about 30 torr, about 100 cm/second at about 100 torr, about 45 cm/second at about 200 torr and about 30 cm/second at about 300 torr. More preferably, the velocity is about 350 cm/second at about 30 torr, about 105 cm/second at about 100 torr, about 52 cm/second at about 200 torr and about 35 cm/second at about 300 torr. It is to be understood that the velocity of gas in the first curtain may be other than that described without departing from the scope of the present invention.

For continuous charge embodiments of the process, the gas pressure of the atmosphere over the melt is maintained at a generally constant value in excess of 100 torr throughout the process. Therefore, the gas velocities of the first and second curtains will also remain generally constant. With respect to the first curtain, the gas velocity will exceed about 38 cm/second at about 250 torr, about 34 cm/second at about 275 torr, and about 30 cm/second at about 300 torr. Preferably, the gas velocity will exceed about 44 cm/second at about 250 torr, about 40 cm/second at about 275 torr, and about 35 cm/second at about 300 torr. With respect to the second curtain, the gas velocity will exceed about 28 cm/second at about 250 torr, about 24 cm/second at about 275 torr, and about 20 cm/second at about 300 torr. Preferably, the gas velocity will exceed about 33 cm/second at about 250 torr, about 29 cm/second at about 275 torr, and about 25 cm/second at about 300 torr. It is to be understood that the velocity of gas in both the first and second curtains may be other than that described without departing from the scope of the present invention.

This high velocity flow of inert gas acts to aspirate the vapors and particulate present over the melt surface, and carry this mixture radially and outwardly away from the melt surface. This flow of gas, vapors and particulate is then exhausted from the chamber through the exhaust ports 37. In the preferred embodiment, the nozzles 39 producing the first curtain of purge gas and the sleeve 47, neck portion 59, collar 51 and purge lines producing the second curtain of gas constitute the purge gas delivery structure.

Figure 4:
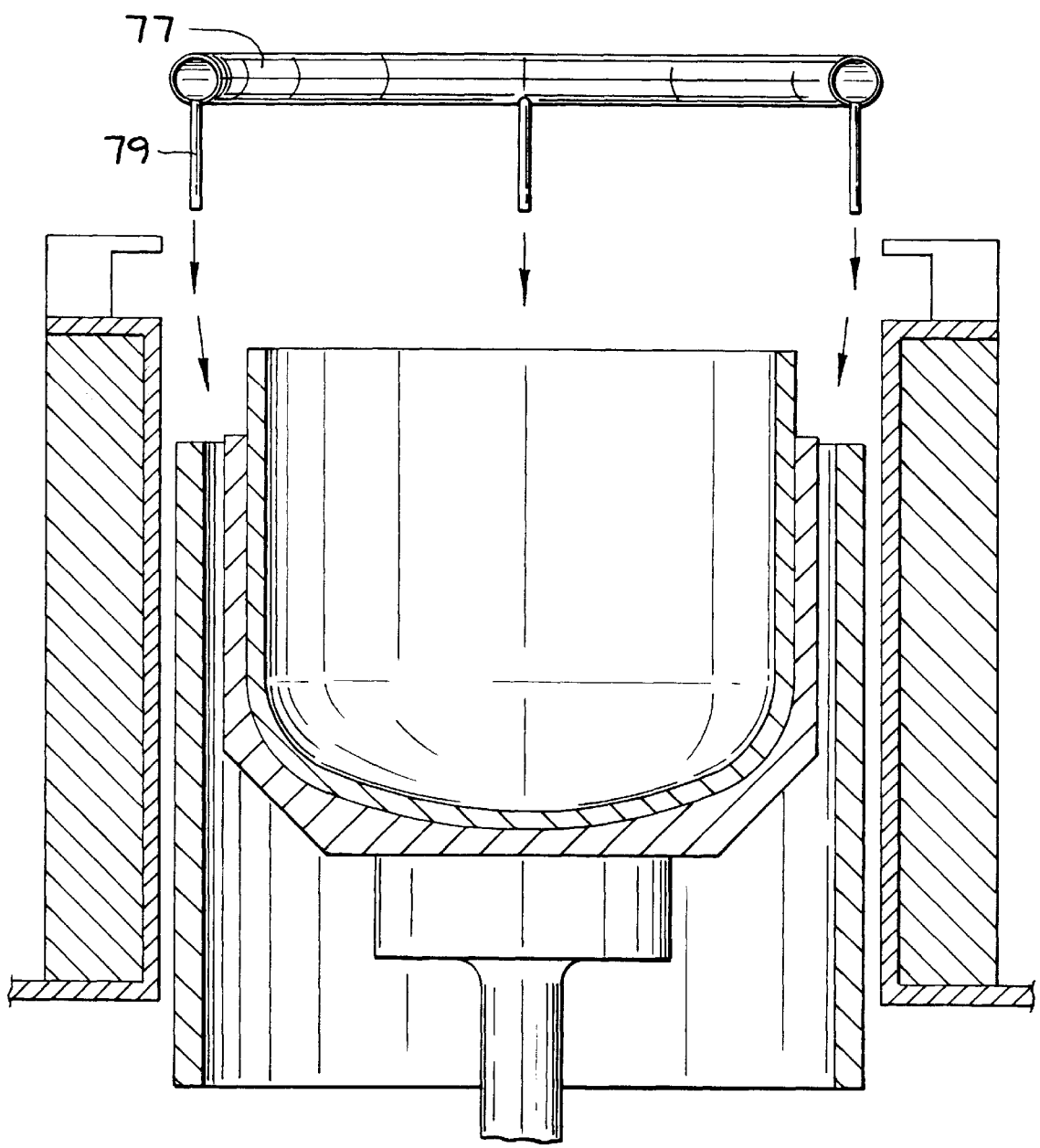
FIG. 4 is a fragmentary, sectional view of a crystal puller showing an alternate embodiment of a purge system.

Referring now to FIG. 4, the purge gas delivery structure of a second embodiment is shown. The nozzles 39 of the first embodiment are replaced by a torroidal manifold 77 supported inside the crystal growing chamber 5. Downwardly projecting delivery tubes 79 extend from the manifold 77 to deliver purge gas to form the first curtain. The spacial relationship of these tubes 79 is the same as that of the nozzles 39 in the first embodiment. A single purge gas feed line (not shown) may be used to feed the manifold 77. The manifold may be used in conjunction with the sleeve 47, neck portion 59, and collar 51 so that both the first and second curtains are provided.

It is to be noted that the provision of the second curtain is optional in both the first and second embodiments of the present invention.

Figure 5:
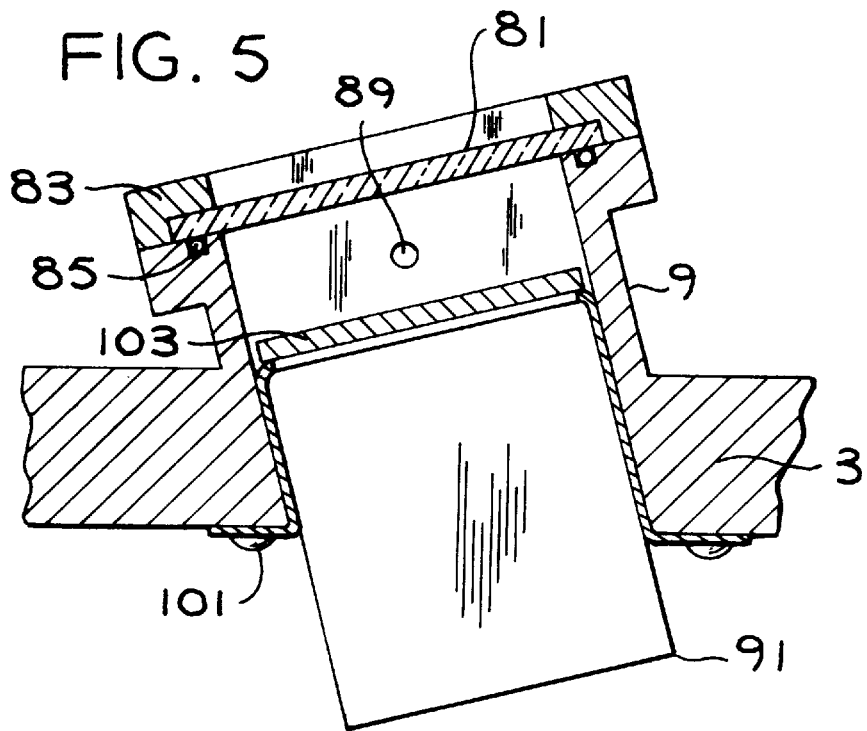
FIG. 5 is an enlarged, fragmentary view of a view port of the crystal puller showing baffling of the present invention.

Notwithstanding the provision of the purge system, some silicon and silicon dioxide will be deposited on the internal surfaces of the crystal puller 1. It is particularly important that the view of the interior of the crystal growth chamber 5 through the view port 9 remain unobstructed. Referring to FIG. 5, the view port 9 includes a port formed in the shell 3 which has a rectangular cross section. A transparent window 81 is sealingly mounted in the port near its upper end. A cover 83 attached to the port forces the window 81 into sealing engagement with an O-ring 85 in a groove in the port to obtain the seal. As is conventional, a purge gas line 87 (see FIG. 7) is connected to the port 9 by an inlet 89 to allow for the injection of purge gas just below the transparent window 81. However, the provision of the purge gas does not prevent the condensation of material on the window 81, which soon eliminates its transparency.

Baffling indicated generally at 91 is received in a lower end of the port 9 which opens into the crystal growth chamber 5. The baffling 91 cooperates with the purge gas flow from the purge gas line 87 to inhibit migration of vapors and particulate to the transparent window 81. The baffling 91 comprises a plurality of thin molybdenum baffles 93 (see FIG. 6) mounted generally in a spaced apart face-to-face relation adjacent to the view port 9. The spacing is selected to stagnate gases from the atmosphere above the crucible 11 between the baffles 93 while permitting viewing through the baffling and is about 2 to about 4 cm in the preferred embodiment. It is to be understood that the material of the baffles and their spacing may be other than that described without departing from the scope of the present invention.

Figure 6:
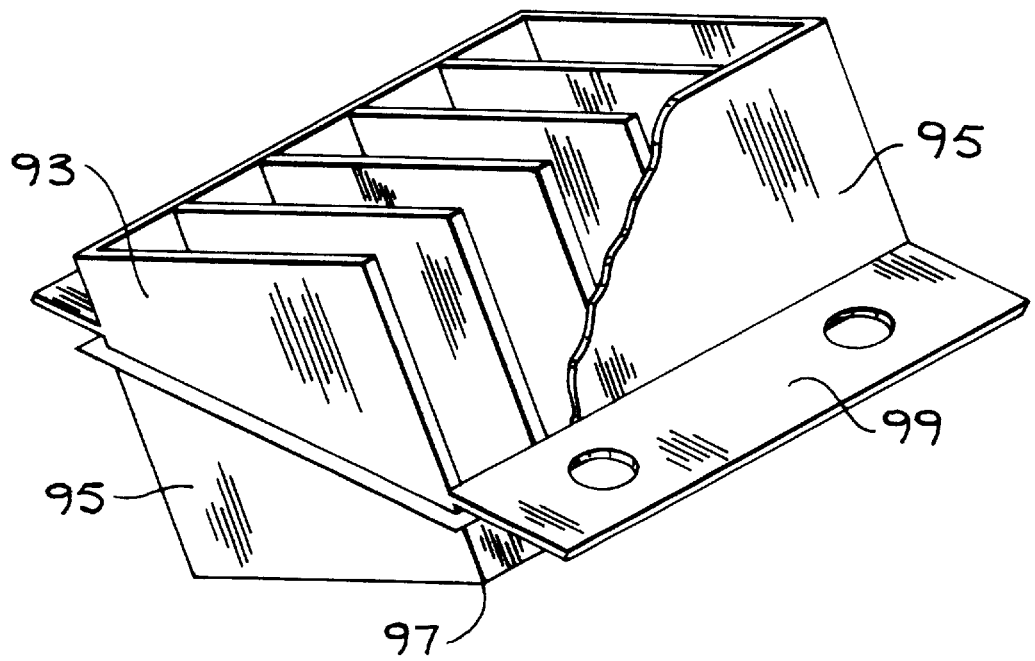
FIG. 6 is a bottom perspective view of the view port baffling with parts broken away to show internal construction.
Figure 7:
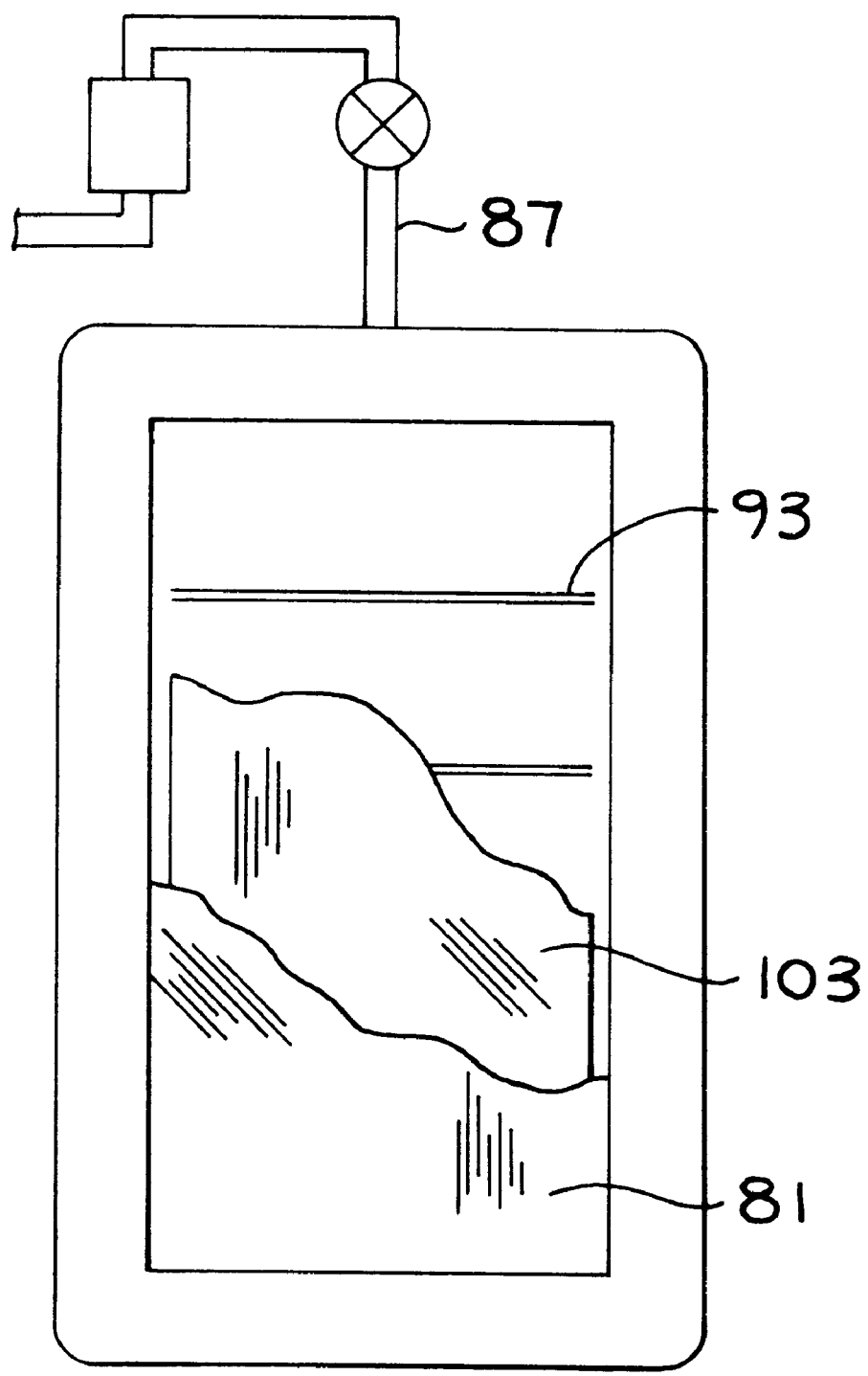
FIG. 7 is a top plan view of the view port with parts broken away to show internal construction.

Referring to FIGS. 5, 6 and 7, the thin baffles 93 extend between opposing side walls 95 of a frame 97 by which they are supported. A flange 99 projecting outwardly from each side wall 95 is mounted by a suitable fastener 101 on the interior of a top wall of the shell 3. The frame 97 also supports a sacrificial window 103 in the port above the baffles 93. The sacrificial window 103 rests on the upper ends of the baffles 93 and accepts deposits from any vapor which is able to migrate through the baffles from the crystal growth chamber 5. It is a relatively simple and inexpensive matter to replace the sacrificial window 103 by disconnecting the frame 97 from the shell 3 and sliding the frame out of the port 9. The sacrificial window 103 substantially closes spaces between the baffles 93 at the top of the baffling. However, the sacrificial window 103 and the frame 97 do permit purge gas from the purge line 87 to flow around the edges of the window and into the spaces between the baffles 93 so that there is some positive pressure to drive unwanted vapors downwardly from between the baffles.

As illustrated in the following Example, the process of the present invention may be used to control the oxygen content in single crystal silicon rods heavily doped, i.e. having a resistivity of about 8 to about 20 mohm-cm, with antimony or arsenic such that a medium to high, i.e. about 13 to greater than 16 PPMA, oxygen content is achieved. The Example sets forth one set of conditions that may be used to achieve the desired result. Data similar to that given in Tables I, II and FIG. 8 can be generated for other crystal diameters, crucible and polysilicon charge sizes. Accordingly, the Example should not be interpreted in a limiting sense.

EXAMPLE

In accordance with the process of the present invention, a single crystal silicon rod (150 mm nominal diameter) was pulled from a 350 mm diameter crucible containing a 34 kg molten silicon charge, doped with antimony, using the apparatus of FIG. 1. Table I indicates the rate at which the gas pressure of the atmosphere over the melt was increased as the fraction of silicon melt solidified increased. Table II indicates the decrease in the velocity of purge gas entering the crystal growth chamber from the first and second curtains of the purge system as the gas pressure over the silicon melt was increased.

TABLE I

| % of Melt Solidified | Furnace Pressure (torr) |
| --- | --- |
| 10 | 34 |
| 20 | 65 |
| 30 | 85 |
| 40 | 110 |
| 50 | 140 |
| 60 | 180 |
| 70 | 225 |
| 80 | 260 |
| 90 | 300 |
| 100 | 300 |

TABLE II

| Furnace Pressure (torr) | Gas Velocity of First Curtain (cm/second) | Gas Velocity of Second Curtain (cm/second) |
| --- | --- | --- |
| 30 | 350 | 281 |
| 100 | 105 | 84 |
| 200 | 52 | 42 |
| 300 | 35 | 28 |

Figure 8:
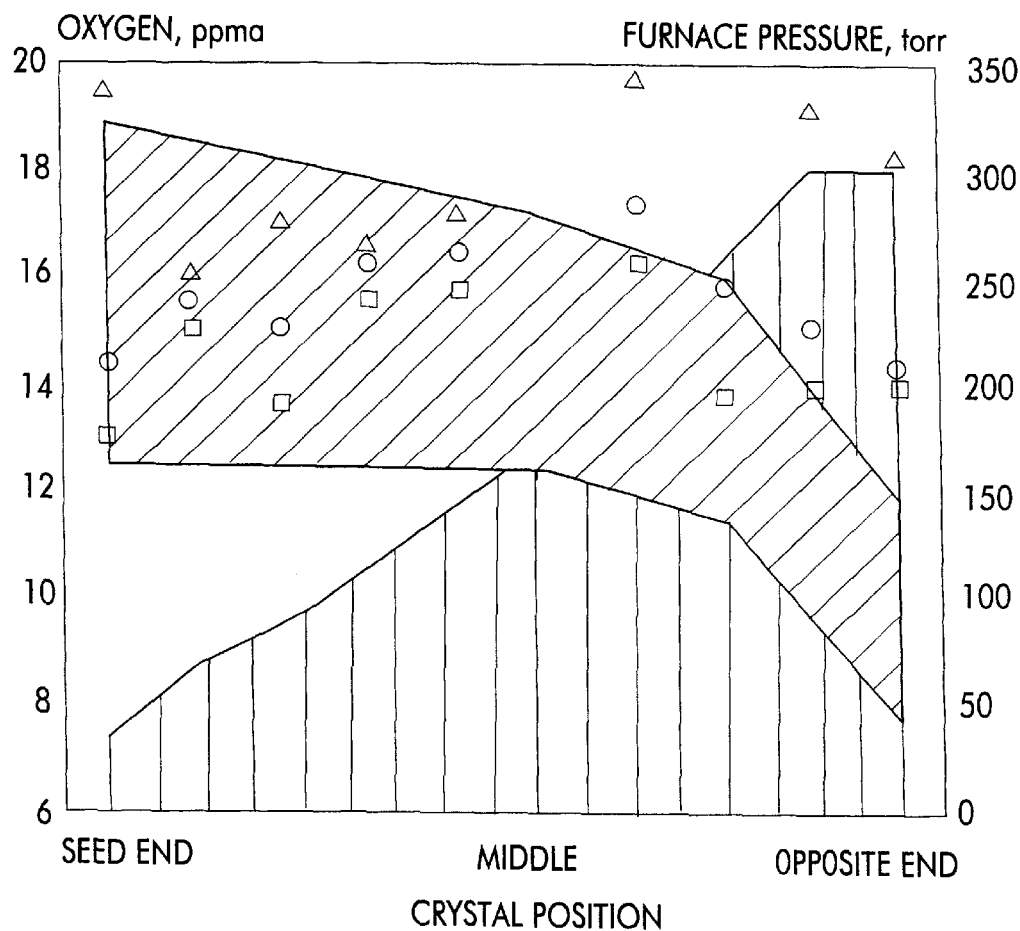
FIG. 8 is a chart illustrating the axial oxygen contents of three silicon rods produced using the present invention, as well as the range of axial oxygen contents obtained using conventional pressure conditions.

The axial oxygen contents of three single crystal silicon rods, each produced according to the process as set forth in this Example, are provided in FIG. 8. It can be seen that the axial oxygen content ranges from about 13 to greater than 16 PPMA for each silicon rod. Also presented in FIG. 8 are two shaded areas. One shaded area illustrates the range of oxygen concentrations obtained as a function of the crystal position using conventional pressure conditions, which are typically between about 10 to about 20 torr. The other shaded area illustrates the change in gas pressure utilized for the three rods for which the oxygen data is presented.

Upon comparison of these axial oxygen contents, it is to be noted that the several objects of the present invention are achieved. Without increasing the gas pressure over the melt as the fraction of melt solidified increases, the axial oxygen content falls below the desired medium to high oxygen content range after about 40 percent to about 60 percent of the melt has solidified.

As various changes could be made in the above method without departing from the scope of the invention, it is intended that all matter contained in the above description shall be interpreted as illustrative and not in a limiting sense.

What is claimed is:

1. A process for controlling oxygen content in a single crystal silicon rod which is pulled from a silicon melt in accordance with Czochralski method, the silicon melt being contained within a hermetically sealed chamber of a crystal puller wherein an atmosphere is maintained over the silicon melt, the process comprising
    adjusting the gas pressure of the atmosphere over the melt as the single crystal silicon rod is grown to a value in excess of 100 torr; and,
    aspirating vapors and particulate away from the melt.

2. A process as set forth in claim 1 wherein the gas pressure of the atmosphere over the melt is adjusted to a value of at least about 250 torr.

3. A process as set forth in claim 1 wherein the gas pressure of the atmosphere over the melt is adjusted to a value of at least about 275 torr.

4. A process as set forth in claim 1 wherein the gas pressure of the atmosphere over the melt is adjusted to a value of at least about 300 torr.

5. A process as set for in claim 1 wherein the gas pressure is progressively increased as the fraction of the silicon melt solidified increases.

6. A process as set forth in claim 5 wherein the progressively increasing gas pressure exceeds about 50 torr after about 25 percent of the melt has solidified, about 100 torr after about 60 percent of the melt has solidified, and about 200 torr after about 75 percent of the melt has solidified.

7. A process as set forth in claim 5 wherein the progressively increasing gas pressure exceeds about 75 torr after about 25 percent of the melt has solidified, about 100 torr after about 50 percent of the melt has solidified, and about 240 torr after about 75 percent of the melt has solidified.

8. A process as set forth in claim 1 wherein the gas pressure of the atmosphere over the melt is increased to maintain the oxygen content within the range of about 14 to about 17 PPMA.

9. A process as set forth in claim 1 wherein aspirating vapors and particulate further comprises
    aspirating vapors and particulate radially outwardly of a perimeter of an open top of a crucible containing the melt with a first curtain of purge gas, and
    aspirating vapors and particulate radially inwardly of the perimeter of the open top of the crucible with a second curtain of purge gas.

10. A process as set forth in claim 9 wherein the velocity of purge gas from the second curtain is less than that of the first curtain.

11. A process as set forth in claim 9 wherein the velocity of purge gas from the first curtain and the second curtain decreases as the gas pressure of the atmosphere over the melt increases.

12. A process for controlling oxygen content in a single crystal silicon rod which is pulled from a silicon melt containing antimony or arsenic as a dopant in accordance with Czochralski method, the silicon melt being contained within a hermetically sealed chamber of a crystal puller wherein an atmosphere is maintained over the silicon melt, the process comprising
    adjusting the gas pressure of the atmosphere over the melt as the single crystal silicon rod is grown; and,
    aspirating vapors and particulate away from the melt.

13. A process as set forth in claim 12 wherein the gas pressure of the atmosphere over the melt is adjusted to a value of at least about 250 torr.

14. A process as set forth in claim 12 wherein the gas pressure of the atmosphere over the melt is adjusted to a value of at least about 275 torr.

15. A process as set forth in claim 12 wherein the gas pressure of the atmosphere over the melt is adjusted to a value of at least about 300 torr.

16. A process as set for in claim 12 wherein the gas pressure is progressively increased as the fraction of the silicon melt solidified increases.

17. A process as set forth in claim 16 wherein the progressively increasing gas pressure exceeds about 50 torr after about 25 percent of the melt has solidified, about 100 torr after about 60 percent of the melt has solidified, and about 200 torr after about 75 percent of the melt has solidified.

18. A process as set forth in claim 16 wherein the progressively increasing gas pressure exceeds about 75 torr after about 25 percent of the melt has solidified, about 100 torr after about 50 percent of the melt has solidified, and about 240 torr after about 75 percent of the melt has solidified.

19. A process as set forth in claim 12 wherein the gas pressure of the atmosphere over the melt is increased to maintain the oxygen content within the range of about 14 to about 17 PPMA.

20. A process as set forth in claim 12 wherein aspirating vapors and particulate further comprises aspirating vapors and particulate radially outwardly of a perimeter of an open top of a crucible containing the melt with a first curtain of purge gas, and aspirating vapors and particulate radially inwardly of the perimeter of the open top of the crucible with a second curtain of purge gas.

21. A process as set forth in claim 20 wherein the velocity of purge gas from the second curtain is less than that of the first curtain.

22. A process as set forth in claim 20 wherein the velocity of purge gas from the first curtain and the second curtain decreases as the gas pressure of the atmosphere over the melt increases.

23. A process for removing vapors and particulate generated during the production of a single crystal silicon rod which is pulled from a silicon melt in accordance with Czochralski method, the silicon melt being contained within a hermetically sealed chamber of a crystal puller wherein an atmosphere is maintained over the silicon melt, the process comprising:

purging the atmosphere within the crystal growth chamber radially outwardly of the perimeter of the open top of the crucible with a first curtain of purge gas to remove vapors and particulate away from the surface of the melt, and purging the atmosphere within the crystal growth chamber radially inwardly of the perimeter of the open top of the crucible with a second curtain of purge gas to remove vapors and particulate away from the surface of the silicon rod and melt.

24. A process as set forth in claim 23 wherein the velocity of purge gas from the second curtain is less than that of the first curtain.

25. A process as set forth in claim 23 wherein the velocity of purge gas from the first curtain and the second curtain decreases as the gas pressure of the atmosphere over the melt increases.

26. A process for controlling oxygen content in a single crystal silicon rod which is pulled from a silicon melt in accordance with Czochralski method, the silicon melt being contained within a hermetically sealed chamber of a crystal puller wherein an atmosphere is maintained over the silicon melt, the process comprising adjusting the gas pressure of the atmosphere over the melt as the single crystal silicon rod is grown to a value in excess of 100 torr; and, purging the atmosphere over the melt.

27. A process as set for in claim 26 wherein the gas pressure is progressively increased as the fraction of the silicon melt solidified increases.

28. A process as set forth in claim 27 wherein the progressively increasing gas pressure exceeds about 50 torr after about 25 percent of the melt has solidified, about 100 torr after about 60 percent of the melt has solidified, and about 200 torr after about 75 percent of the melt has solidified.

29. A process as set forth in claim 27 wherein the gas pressure of the atmosphere over the melt is increased to maintain the oxygen content within the range of about 14 to about 17 PPMA.

30. A process as set forth in claim 27 wherein purging the atmosphere over the melt further comprises purging the atmosphere radially outwardly of a perimeter of an open top of a crucible containing the melt with a first curtain of purge gas, and purging the atmosphere radially inwardly of the perimeter of the open top of the crucible with a second curtain of purge gas.

31. A process as set forth in claim 30 wherein the velocity of purge gas from the second curtain is less than that of the first curtain.

32. A process as set forth in claim 30 wherein the velocity of purge gas from the first curtain and the second curtain decreases as the gas pressure of the atmosphere over the melt increases.

* * * * *

UNITED STATES PATENT AND TRADEMARK OFFICE
CERTIFICATE OF CORRECTION

PATENT NO. : 5,904,768
DATED : May 18, 1999
INVENTOR(S) : John D. Holder

It is certified that error appears in the above-identified patent and that said Letters Patent is hereby corrected as shown below:

Column 10, claim 5,
Line 1, "as set for" should read -- as set forth --.

Column 12, claim 27,
Line 12, "as set for" should read -- as set forth --.

Column 12, claim 29,
Line 21, "claim 27" should read -- claim 26 --.

Column 12, claim 30,
Line 25, "claim 27" should read -- claim 26 --.

Signed and Sealed this

Fourth Day of December, 2001

*Attest:*

*Attesting Officer*

NICHOLAS P. GODICI
*Acting Director of the United States Patent and Trademark Office*